United States Patent
Koutake et al.

(10) Patent No.: US 8,758,087 B2
(45) Date of Patent: Jun. 24, 2014

(54) WAFER PROCESSING METHOD, WAFER POLISHING APPARATUS, AND INGOT SLICING APPARATUS

(75) Inventors: Kyohei Koutake, Kariya (JP); Hiromichi Morita, Kariya (JP); Fumiyoshi Kano, Chiryu (JP); Tetsuji Yamaguchi, Obu (JP); Sumitomo Inomata, Toyota (JP); Masatake Nagaya, Seto (JP)

(73) Assignee: DENSO CORPORATION, Kariya (JP)

( * ) Notice: Subject to any disclaimer, the term of this patent is extended or adjusted under 35 U.S.C. 154(b) by 446 days.

(21) Appl. No.: 13/114,141

(22) Filed: May 24, 2011

(65) Prior Publication Data
US 2011/0294403 A1    Dec. 1, 2011

(30) Foreign Application Priority Data

May 25, 2010    (JP) .................................. 2010-119204

(51) Int. Cl.
*B24B 1/00*    (2006.01)
*B24B 49/16*    (2006.01)

(52) U.S. Cl.
USPC ..................................... 451/8; 451/7; 451/54

(58) Field of Classification Search
CPC ............ B24B 1/00; B24B 7/22; B24B 7/228; B28D 5/022; B28D 5/0082; H01L 21/02008; H01L 21/02013; H01L 21/0203; H01L 21/2636; H01L 21/304
USPC ........................ 451/53, 54, 55, 7, 8
See application file for complete search history.

(56) References Cited

U.S. PATENT DOCUMENTS

| | | | |
|---|---|---|---|
| 6,689,284 B1 | 2/2004 | Nakasaki | |
| 6,849,192 B2 | 2/2005 | Nakasaki | |
| 7,351,282 B2 * | 4/2008 | Yamaguchi | 117/13 |
| 2009/0142247 A1 | 6/2009 | Sun et al. | |

FOREIGN PATENT DOCUMENTS

| JP | 64087713 | * | 9/1987 |
|---|---|---|---|
| JP | A-64-087713 | | 3/1989 |
| JP | 06328352 A | * | 11/1994 |
| JP | A-06-328352 | | 11/1994 |
| JP | 2001168076 A | * | 6/2001 |
| JP | 2002249762 A | * | 9/2002 |
| JP | A-2002-249762 | | 9/2002 |
| JP | A-2003-318139 | | 11/2003 |
| JP | A-2004-066734 | | 3/2004 |
| JP | 2006245498 A | * | 9/2006 |
| JP | A-2006-245498 | | 9/2006 |

(Continued)

OTHER PUBLICATIONS

Office Action mailed May 8, 2012 issued in corresponding JP application No. 2010-119204 (and English translation attached).

*Primary Examiner* — Lee D Wilson
*Assistant Examiner* — Tyrone V Hall, Jr.
(74) *Attorney, Agent, or Firm* — Posz Law Group, PLC

(57) ABSTRACT

In a wafer processing method, an ingot is sliced into a wafer and the wafer is planarized by polishing a surface of the wafer. When the wafer is planarized, the wafer is disposed on a wafer holder and the wafer is rotated, a heat quantity is applied to a portion of the wafer so as to form a reformed layer at the portion of the wafer, and a polishing tool is brought into contact with the portion of wafer while rotating so as to polish the portion of the wafer.

6 Claims, 7 Drawing Sheets

(56) References Cited

FOREIGN PATENT DOCUMENTS

| JP | A-2007-253244 | 10/2007 |
| JP | A-2007-311586 | 11/2007 |
| JP | A-2009-283629 | 12/2009 |
| WO | WO 2007/055124 | 5/2007 |
| WO | WO 2007055124 A1 * | 5/2007 |

* cited by examiner

WAFER PROCESSING METHOD, WAFER POLISHING APPARATUS, AND INGOT SLICING APPARATUS

CROSS REFERENCE TO RELATED APPLICATIONS

The present application is based on and claims priority to Japanese Patent Application No. 2010-119204 filed on May 25, 2010, the contents of which are incorporated in their entirety herein by reference.

BACKGROUND OF THE INVENTION

1. Field of the Invention

The present invention relates to a wafer processing method, a wafer polishing apparatus, and an ingot slicing apparatus.

2. Description of the Related Art

Conventionally, a wafer is formed by slicing an ingot and a wafer is planarized by polishing a surface of the wafer. In a case where a high hardness wafer such as a silicon carbide (SiC) wafer is planarized by polishing, a reformed layer having a lower harness than SiC is formed at a surface portion of the SiC wafer and the reformed layer is polished so as to improve a processing efficiently compared with a case where the SiC wafer is polished without forming a reformed layer.

For example, JP-A-2009-283629 discloses a planarization method in which a SiC wafer is heated in a heating furnace so as to form $SiO_2$ having a lower hardness than SiC at a surface portion of the SiC wafer as a reformed layer, and a surface of the SiC wafer is planarized by removing $SiO_2$.

JP-A-2009-141353 (corresponding to US 2009/0142247 A1) discloses a planarization method in which a SiC wafer is oxidized in a ultrasonic bath so as to form $SiO_2$ having a lower hardness than SiC at a surface portion of the SiC wafer as a reformed layer, and a surface of the SIC wafer is planarized by removing $SiO_2$, for example, by wet etching.

However, in the above-described planarization methods, the reformed layer is formed along the surface of the wafer. If the wafer has a rough surface, the reformed layer is formed along the rough surface. Thus, when a planarization process is performed, there is a possibility that the reformed layer is completely removed at a protruding portion of the wafer and then a structure formed in the wafer is also polished. Therefore, a processing efficiency cannot be improved sufficiently. Furthermore, when the structure formed in the high hardness wafer is polished, a defect such as dislocation may be caused under a polished surface.

In order to solve the above-described issue, a reforming process for forming the reformed layer on the wafer and a planarization process for polishing the surface of the wafer may be alternately performed so that the reformed layer can be polished with certainty in the planarization process. However, in the above-described methods, the reforming process and the planarization process are performed with different apparatuses. Thus, when the reforming process and the planarization process are alternately performed, the number of manufacturing processes is increased, and the processing efficiency is reduced.

JP-A-2007-311586 discloses a planarization process in which an oxidizing agent including colloidal silica is mixed into an abrasive agent so that $SiO_2$ having a lower hardness than SiC is formed at a surface portion of a SiC wafer when a surface of the SiC wafer is planarized with the abrasive agent.

An oxidation rate by an oxidizing agent is lower than an oxidation rate by thermal oxidation. Thus, when the reformed layer is formed with an oxidizing agent, it takes a long time to form the reformed layer and the processing efficiency cannot be improved sufficiently. Furthermore, because a polishing apparatus is subjected to the oxidizing agent, the polishing apparatus may be damaged in the long term.

SUMMARY OF THE INVENTION

In view of the foregoing problems, it is an object of the present invention to provide a wafer processing method, a wafer polishing apparatus, and an ingot slicing apparatus that can improve a processing efficiency.

In a wafer processing method according to a first aspect of the present invention, an ingot is sliced into a wafer and the wafer is planarized by polishing a surface of the wafer. When the wafer is planarized, the wafer is disposed on a wafer holder and the wafer is rotated, a heat quantity is applied to a portion of the wafer so as to form a reformed layer at the portion of the wafer, and a polishing tool is brought into contact with the portion of wafer while rotating so as to polish the portion of the wafer.

In the wafer processing method according to the first aspect, a reforming process for forming of the reformed layer and a polishing process for polishing the surface of the wafer can be performed as a parallel process or a single process. Thus, a wafer processing efficiency can be improved compared with a case where the reforming process and the polishing process are performed with different apparatuses. Furthermore, because the reformed layer is formed by applying the heat quantity, the wafer processing efficiency can be improved and a damage of a polishing apparatus can be restricted.

In a wafer processing method according to a second aspect of the present invention, an ingot is sliced into a wafer and the wafer is planarized by polishing a surface of the wafer. When the ingot is sliced, the ingot is disposed on an ingot holder and the ingot is rotated, a heat quantity is applied to a portion of the ingot so as to form a reformed layer at the portion of the ingot, and a slicing tool is brought into contact with the portion of ingot while rotating so as to cut the portion of the ingot.

In the wafer processing method according to the second aspect, the reformed layer is formed by applying the heat quantity to a portion of the ingot and the ingot is sliced into the wafer by bringing the slicing tool into contact with the portion of the ingot applied with the heat quantity. Because the slicing tool cuts the reformed layer having a lower hardness than the ingot, a time required for slicing the ingot can be reduced compared with a case where the ingot is sliced without forming the reformed layer. Furthermore, because a surface roughness of the wafer can be restricted, a time required for planarizing the wafer can be reduced. Thus, a wafer processing efficiency can be improved.

A polishing apparatus according to a third aspect of the present invention includes a wafer holder, a polishing tool, and a reforming unit. The wafer holder rotates in a state where the wafer holder holds a wafer. The polishing tool is disposed above the wafer holder and the polishing tool polishes the wafer by coming into contact with a portion of the wafer while rotating. The reforming unit applies a heat quantity to the portion of the wafer with which the polishing tool comes into contact so as to form a reformed layer.

The polishing apparatus according to the third aspect includes the polishing tool and the reforming unit. Thus, a wafer processing efficiency can be improved compared with a case where a reforming process for forming the reformed layer and a polishing process for polishing the wafer are performed with different apparatuses.

A slicing apparatus according to a fourth aspect of the present invention includes an ingot holder, a slicing tool, and a reforming unit. The ingot holder rotates in a state where the ingot holder holds the ingot. The slicing tool slices the ingot by coming into contact with a portion of the ingot while rotating. The reforming unit applies a heat quantity to the portion of the ingot with which the slicing tool comes into contact so as to form a reformed layer.

The slicing apparatus according to the fourth aspect includes the slicing tool and the reforming unit. Thus, the slicing apparatus can slice the ingot while applying the heat quantity to the portion of the ingot with which the slicing tool comes into contact and forming the reformed layer at the portion of the ingot. Because the slicing tool cuts the reformed layer having a lower hardness than the ingot, a time required for slicing the ingot can be reduced compared with a case where the ingot is sliced without forming the reformed layer. Furthermore, because a surface roughness of the wafer can be restricted, a time required for planarizing the wafer can be reduced. Thus, a wafer processing efficiency can be improved.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
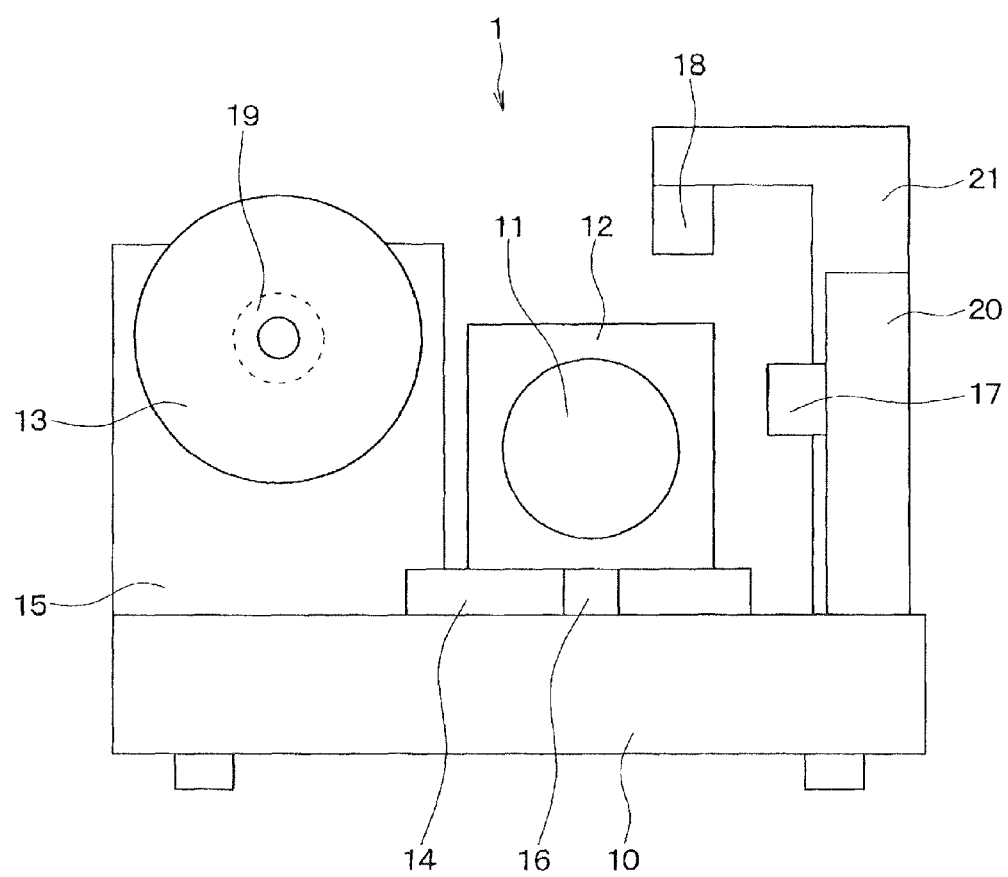
FIG. 1 is a diagram showing a slicing apparatus according to a first embodiment.

A slicing apparatus 1 according to a first embodiment will be described with reference to FIG. 1.

The slicing apparatus 1 includes a bed 10, an ingot holder 12, and a slicing tool 13. The bed 10 has a horizontal surface. The ingot holder 12 and the slicing tool 13 are disposed above the surface of the bed 10.

The ingot holder 12 is configured to hold an ingot 11 and includes a rotation mechanism which is not shown. The ingot holder 12 is disposed above the surface of the bed 10 through a saddle 14. The saddle 14 is expandable in a normal direction to the surface of the bed 10 and is movable in a parallel direction to the surface of the bed 10. Thus, by expanding and moving the saddle 14, the ingot holder 12 is movable in the normal direction to the surface of the bed 10 and the parallel direction to the surface of the bed 10. The ingot holder 12 holds the ingot 11 through the rotation mechanism. When a center axis of the ingot 11 extending in a longitudinal direction of the ingot 11 is set to a rotation axis, the ingot holder 12 can rotate the ingot 11 around the rotation axis by rotating the rotation mechanism. In the present embodiment, the ingot 11 rotates counterclockwise. The ingot 11 held by the ingot holder 12 includes, for example, a silicon single crystal ingot and a SiC single crystal ingot.

The slicing tool 13 comes into contact with the ingot 11 while rotating and thereby slicing the ingot 11. The slicing tool 13 is disposed to a side of the ingot 11. The slicing tool 13 is attached to a column 15. The column 15 is disposed on the surface of the bed 10 and is movable in the parallel direction to the surface of the bed 10. Thus, by moving the column 15, the slicing tool 13 is movable in the parallel direction to the surface of the bed 10. The slicing tool 13 is attached to the column 15 through a spindle which is not shown. The spindle extends in a direction parallel to the longitudinal direction of the ingot 11. When the spindle rotates, the slicing tool 13 rotates with the spindle. In the present embodiment, the slicing tool 13 rotates clockwise.

The slicing apparatus 1 further includes a height detecting unit 16, a reforming unit 17, a temperature detecting unit 18, a resistance detecting unit 19, a column 20, a column 21, and a control unit which is not shown. The height detecting unit 16 detects a height of a portion of the ingot 11 with which the slicing tool 13 comes into contact. The reforming unit 17 applies a heat quantity to the portion of the ingot 11 with which the slicing tool 13 comes into contact based on the height detected by the height detecting unit 16. The temperature detecting unit 18 detects a temperature at the portion of the ingot 11 to which the heat quantity is applied. The resistance detecting unit 19 detects a resistance (load) that is generated when the slicing tool 13 comes into contact with the portion of the ingot 11 to which the heat quantity is applied. The control unit controls the height detecting unit 16, the reforming unit 17, the temperature detecting unit 18, and the resistance detecting unit 19.

The height detecting unit 16 is disposed on the surface of the bed 10. The height detecting unit 16 is movable in the parallel direction to the surface of the bed 10. The height detecting unit 16 includes, for example, a laser displacement gauge for detecting a distance. The height detecting unit 16 detects the height of the portion of the ingot 11 with which the slicing tool 13 comes into contact, that is, a surface condition of a portion of the ingot 11 cut by the slicing tool 13 in a circumferential direction (rotation direction) and outputs the detected height to the control unit. The ingot 11 has asperity on a peripheral surface thereof. Thus, a detected distance is short when a detected portion protrudes from a surrounding portion, and a detected distance is long when a detected portion is depressed from a surrounding portion. In the following description, when a distance detected by the height detecting unit 16 is short, that is, when the height detecting unit 16 detects a protruding portion in the ingot 11, it is described that a detected height is high. On the other hand, when a distance detected by the height detecting unit 16 is long, that is, when the height detecting unit 16 detects a depressed portion in the ingot 11, it is described that a detected height is low.

The column 20 is movable in the parallel direction to the surface of the bed 10. The reforming unit 17 is attached to the column 20 and is arranged to an opposite side of the ingot 11 from the slicing tool 13. The reforming unit 17 applies the heat quantity to the portion of the ingot 11 with which the slicing tool 13 comes into contact and forms a reformed layer on the peripheral surface of the ingot 11. The reforming unit 17 applies the heat quantity to the ingot 11 in proportional to the height detected by the height detecting unit 16. When the detected height is high, the reforming unit 17 applies a large heat quantity compared with when the detected height is low. When the ingot 11 rotates 360 degree, in a cross section of the ingot 11 perpendicular to the rotation axis, the reforming unit 17 applies the heat quantity to a portion of the ingot 11 at a uniform distance from the rotation axis. Thus, the reformed layer is formed from the peripheral surface to the portion of the ingot 11 at a predetermined distance from the rotation axis in the whole circumference. In other words, the reforming unit 17 applies the heat quantity to the ingot 11 so that the reformed layer is formed to the portion at the predetermined distance from the rotation axis regardless of the shape of the peripheral surface of the ingot 11.

The reformed layer has a lower hardness than a base material. For example, when the base material is SiC, the reformed layer is $SiO_2$ or a layer in which Si is sublimed from SiC.

The reforming unit 17 includes, for example, a laser oscillator, a mirror, and a condensing lens. The laser oscillator generates a laser light. The mirror reflects the laser light from the laser oscillator in a predetermined direction. The condensing lens condenses the laser light reflected by the mirror. By irradiating the laser light to the ingot 11, the reforming unit 17 applies the heat quantity to the ingot 11 and the reformed layer is formed.

For example, in a case where the ingot 11 is a SiC single crystal ingot, when the reforming unit 17 irradiates the laser light to the ingot 11 so that a surface temperature of the ingot 11 is from 800° C. to 1650° C., the surface of the ingot 11 can be oxidized and the reformed layer can be formed. When the reforming unit 17 irradiates the laser light to the ingot 11 so that a surface temperature of the ingot 11 is higher than 1650° C., the surface of the ingot 11 is carbonized and the reformed layer can be formed. When the surface of the ingot 11 is oxidized, $SiO_2$ having a lower hardness than SiC is formed. When the surface of the ingot 11 is carbonized, Si component in SiC is sublimated and the hardness of the ingot 11 can be reduced compared with SiC. Furthermore, by irradiating a laser light, the surface of the ingot 11 can be porous or polycrystallized, and thereby a reformed layer can be formed.

The condensing lens may have any shape. When the condensing lens has a large numerical aperture, a focus narrows, and a focus depth is reduced. Thus, variation in a depth of the reformed layer can be restricted and the reformed layer can have a predetermined depth.

The temperature detecting unit 18 is attached to the column 21 and is disposed above the ingot 11. The column 21 is movable in the parallel direction to the surface of the bed 10. The temperature detecting unit 18 includes, for example, a radiation thermometer. The temperature detecting unit 18 detects a temperature of the portion of the ingot 11 to which the heat quantity is applied by the reforming unit 17 and outputs the detected temperature to the control unit.

The resistance detecting unit 19 is attached to the spindle that connects the slicing tool 13 and the column 15. The resistance detecting unit 19 includes, for example, a torque meter. When the slicing tool 13 comes into contact with the ingot 11, the resistance detecting unit 19 detects the resistance (load) transmitted to the rotation mechanism through the slicing tool 13 and outputs the detected resistance to the control unit.

The control unit controls the heat quantity applied to the ingot 11 by the reforming unit 17 based on the height detected by the height detecting unit 16, the temperature detected by the temperature detecting unit 18, and the resistance detected by the resistance detecting unit 19.

The control unit outputs a control signal to the reforming unit 17 so that the reforming unit 17 applies the heat quantity in proportional to the height detected by the height detecting unit 16. When the detected height is high, the reforming unit 17 applies a large heat quantity compared with when the detected height is low so that the reformed layer is formed to the portion of the ingot 11 at the predetermined distance from the rotation axis. The reforming unit 17 may apply the heat quantity so that the reformed layer is formed to a depth to which the slicing tool 13 cuts at one time in addition to the detected height.

The control unit compares the temperature detected by the temperature detecting unit 18 and threshold values. In a case where the detected temperature is lower than a minimum threshold value, the control unit outputs a control signal to the reforming unit 17 so that the reforming unit 17 applies a heat quantity that is larger than the heat quantity proportional to the detected height when the reforming unit 17 applies the heat quantity next time. In a case where the detected temperature is higher than a maximum threshold value, the control unit outputs a control signal to the reforming unit 17 so that the reforming unit 17 applies a heat quantity that is smaller than the heat quantity proportional to the detected height when the reforming unit 17 applies the heat quantity next time. In a case where the reforming unit 17 includes a laser oscillator as described above, errors may be caused in a laser output. Thus, the errors in the laser output are restricted by detecting the temperature after applying the heat quantity and comparing the detected temperature with the threshold values. Accordingly, the reformed layer can be formed to the portion of the ingot 11 at the predetermined distance from the rotation axis with certainty.

In a case where the detected temperature is lower than the minimum threshold value, there is a possibility that the reformed layer is not formed in the ingot 11 or the reformed layer is not formed to a predetermined depth, that is, to the portion at the predetermined distance from the rotation axis. In a case where the detected temperature is higher than the maximum threshold value, there is a possibility that the reformed layer is formed to a depth deeper than the predetermined depth. The threshold values depend on the height of the portion at which the temperature is detected and are determined for each detected point. For example, in a case where the height of the portion at which the temperature is detected is high, the threshold values are set to be higher than a case where the height of the portion at which the temperature is detected is low so that the reformed layer is formed to a deeper portion in the ingot 11.

The control unit also compares the resistance detected by the resistance detecting unit 19 with a threshold value. In a case where the resistance is higher than the threshold value, the control unit outputs a control signal to the reforming unit 17 so that the reforming unit 17 applies a heat quantity larger than a heat quantity proportional to the detected height when the reforming unit 17 applies a heat quantity next time. In the case where the resistance is higher than the threshold value, the reformed layer is not formed at the portion with which the slicing tool 13 comes into contact. The slicing apparatus 1 according to the present embodiment has the above-described configuration. In the slicing apparatus 1 according to the present embodiment, the slicing tool 13 and the reforming unit 17 are disposed separately.

Next, a polishing apparatus 3 according to the present embodiment will be described with reference to FIG. 2.

The polishing apparatus 3 includes a bed 30, a wafer holder 32, and a polishing tool 33. The bed 30 has a horizontal surface, and the wafer holder 32 and the polishing tool 33 are disposed above the surface of the bed 30.

The wafer holder 32 has a circular surface for holding the wafer 31. The wafer holder 32 is disposed above the surface of the bed 30 through the saddle 34 and a rotation mechanism 35. The saddle 34 is expandable in a normal direction to the surface of the bed 30. The rotation mechanism 35 rotates the wafer holder 32. Thus, when the saddle 34 is expanded, the wafer holder 32 moves with the saddle 34 in the normal direction to the surface of the bed 30. In addition, when the rotation mechanism 35 is operated, the wafer holder 32 rotates with the rotation mechanism 35 in a state where the wafer holder 32 holds the wafer 31. In the present embodiment, the wafer 31 rotates counterclockwise as viewed from above the wafer 31.

The polishing tool 33 has a circular plate shape. The polishing tool 33 includes, for example, a grindstone. The polishing tool 33 comes into contact with the ingot 11 at a side surface while rotating, and thereby the surface of the wafer 31 is polished and is planarized. The polishing tool 33 is disposed above the surface of the bed 30. The polishing tool 33 is attached to a column 36 through a spindle 37. The column 36 is movable in a parallel direction to the surface of the bed 30. When the spindle 37 rotates, the polishing tool 33 rotates with the spindle 37. In the present embodiment, the polishing tool 33 rotates clockwise as viewed from the column 36.

The polishing apparatus 3 further includes a height detecting unit 38, a reforming unit 39, a temperature detecting unit 40, a resistance detecting unit 41, and a control unit (not shown). The height detecting unit 38 detects a portion of the wafer 31 with which the polishing tool 33 comes into contact. The reforming unit 39 applies a heat quantity to the portion of the wafer 31 with which the polishing tool 33 comes into contact based on the height detected by the height detecting unit 38. The temperature detecting unit 40 detects a temperature at the portion of the wafer 31 applied with the heat quantity. The resistance detecting unit 41 detects a resistance that is generated when the polishing tool 33 comes into contact with the portion of the wafer 31 applied with the heat quantity. The control unit controls the height detecting unit 38, the reforming unit 39, the temperature detecting unit 40, and the resistance detecting unit 41.

The height detecting unit 38 is disposed above the wafer 31 and is attached to a column 42. The column 42 is movable in the parallel direction to the surface of the bed 30. The height detecting unit 38 includes, for example, a laser displacement gauge for detecting a distance. The height detecting unit 38 detects the height of the portion of the wafer 31 with which the polishing tool 33 comes into contact, that is, a surface condition of the portion of the wafer 31 polished by the polishing tool 33 in a circumferential direction (rotation direction) and outputs the detected height to the control unit. The wafer 31 has asperity on the surface thereof. Thus, a detected distance is short when a detected portion protrudes from a surrounding portion, and a detected distance is long when a detected portion is depressed from a surrounding portion. In the following description, when a distance detected by the height detecting unit 38 is short, that is, when the height detecting height 28 detects a protruding portion in the wafer 31, it is described that a detected height is high. On the other hand, when a distance detected by the height detecting unit 38 is long, that is, when the height detecting unit 38 detects a depressed portion in the wafer 31, it is described that a detected height is low.

The reforming unit 39 is attached to a column 43 that is movable in the parallel direction to the surface of the bed 30. The reforming unit 39 is arranged opposite to the polishing tool 33 above the wafer 31. The reforming unit 39 applies the heat quantity to the portion of the wafer 31 with which the polishing tool 33 comes into contact and forms the reformed layer on a surface portion of the wafer 31. The reforming unit 39 applies the heat quantity to the wafer 31 in proportional to the detected height. When the detected height is high, the reforming unit 39 applies a large heat quantity to the wafer 31 compared with when the detected height is low. Then, at the portion of the wafer 31 applied with the heat quantity, the reformed layer is formed to a portion at a predetermined distance from a surface of the wafer holder 32b regardless of the surface condition of the wafer 31.

The reforming unit 39 applies the heat quantity, for example, by irradiating a laser light. For example, in a case where the wafer 31 is a SiC wafer, when the reforming unit 39 irradiates the laser light to the wafer 31 so that a surface temperature of the wafer 31 is from 800° C. to 1650° C., the surface of the wafer 31 can be oxidized and the reformed layer can be formed. When the reforming unit 39 irradiates the laser light to the wafer 31 so that a surface temperature of the wafer 31 is higher than 1650° C., the surface of the wafer 31 is carbonized and the reformed layer can be formed.

The temperature detecting unit 40 is attached to a column 44 and is arranged above the wafer 31. The column 44 is movable in the parallel direction to the surface of the bed 30. The temperature detecting unit 40 includes, for example, a radiation thermometer. The temperature detecting unit 40 detects the portion of the wafer 31 to which the reforming unit 39 applies the heat quantity and outputs the detected temperature to the control unit.

The resistance detecting unit 41 includes, for example, a torque meter attached to the rotation mechanism 35. When the polishing tool 33 comes into contact with the wafer 31, the resistance detecting unit 41 detects the resistance (load) transmitted to the rotation mechanism 35 through the wafer 31 and the wafer holder 32 and outputs the detected resistance to the control unit.

The control unit controls the heat quantity applied to the wafer 31 by the reforming unit 39 based on the height detected by the height detecting unit 38, the temperature detected by the temperature detecting unit 40, and the resistance detected by the resistance detecting unit 41. The control unit outputs a control signal to the reforming unit 39 so that the reforming unit 39 applies the heat quantity in proportional to the height detected by the height detecting unit 16. When the detected height is high, the reforming unit 39 applies a large heat quantity compared with when the detected height is low so that the reformed layer is formed to the portion of the wafer 31 at the predetermined distance from the surface of the wafer holder 32. The reforming unit 39 may apply the heat quantity so that the reformed layer is formed to a depth to which the polishing tool 33 polishes at one time in addition to the detected height.

The control unit compares the temperature detected by the temperature detecting unit 40 and threshold values. When the detected temperature is lower than a minimum threshold value, the control unit outputs a control signal to the reforming unit 39 so that the reforming unit 39 applies a heat quantity that is larger than the heat quantity proportional to the detected height when the reforming unit 39 applies the heat quantity next time. When the detected temperature is higher than a maximum threshold value, the control device outputs a control signal to the reforming unit 39 so that the reforming unit 39 applies a heat quantity that is smaller than the heat quantity proportional to the detected height when the reforming unit 39 applies a heat quantity next time. When the detected temperature is lower than the minimum threshold value, there is a possibility that the reformed layer is not formed in the wafer 31 or the reformed layer is not formed to a predetermined depth, that is, to the portion at the predetermined distance from the surface of the wafer holder 32. When the detected temperature is higher than the maximum threshold value, there is a possibility that the reformed layer is formed to a depth deeper than the predetermined depth. The threshold values depend on the height of the portion at which the temperature is detected and are determined for each detected point. For example, in a case where the height of the portion at which the temperature is detected is high, the threshold values are set to be higher than a case where the height of the portion at which the temperature is detected is low so that the reformed layer is formed to a deeper portion from the surface of the wafer 31.

The control unit compares the resistance detected by the resistance detecting unit 41 and a threshold value. When the detected resistance is higher than the threshold value, the control unit outputs a control signal to the reforming unit 39 so that the reforming unit 39 applies a heat quantity that is larger than the heat quantity proportional to the detected height when the reforming unit 39 applies the heat quantity next time. When the resistance is larger than the threshold value, the reformed layer is not formed at the portion with which the polishing tool 33 comes into contact. The polishing apparatus 3 according to the present embodiment has the above-described configuration. In the polishing apparatus 3 according to the present embodiment, the polishing tool 33 and the reforming unit 39 are disposed separately.

Next, a wafer processing method with the slicing apparatus 1 and the polishing apparatus 3 will be described below.

Figure 3A:
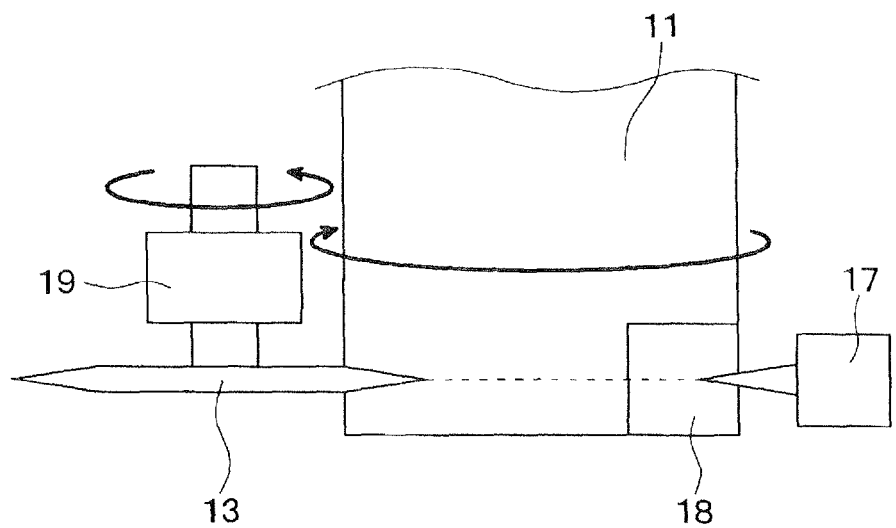
FIG. 3A is a diagram showing a partial top view of the slicing apparatus when the slicing apparatus slices an ingot.
Figure 3B:
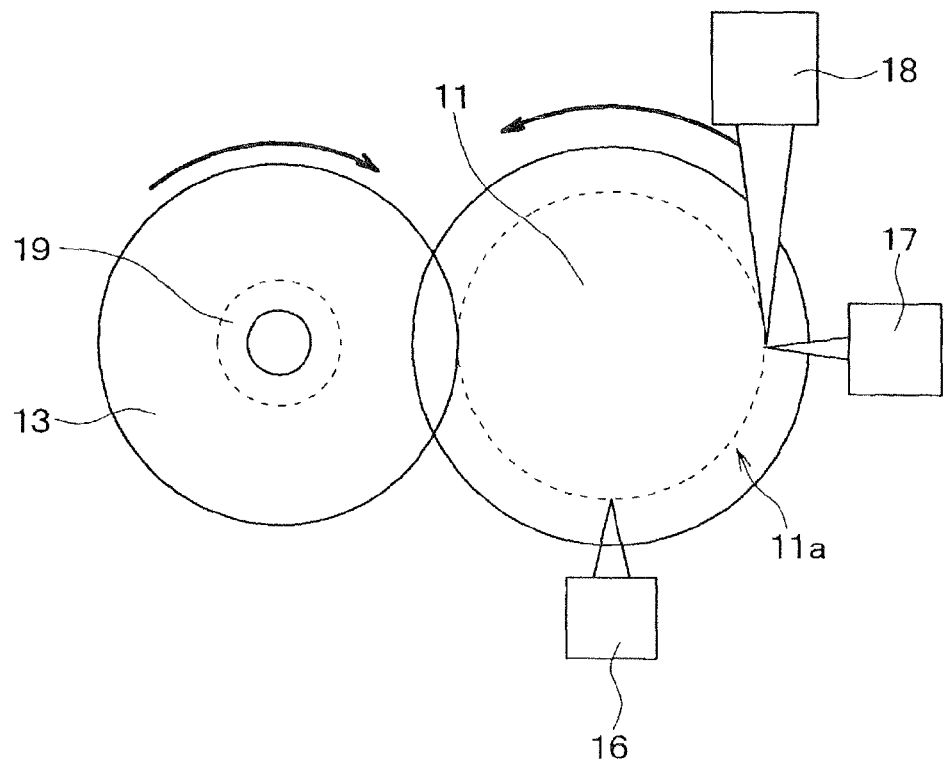
FIG. 3B is a diagram showing a partial side view of the slicing apparatus when the slicing apparatus slices the ingot.

As the ingot 11, for example, a SiC single crystal ingot is prepared. Then, the ingot 11 is sliced with the slicing apparatus 1 in a direction perpendicular to a longitudinal direction of the ingot 11, and thereby the wafer 31 is formed. FIG. 3A is a diagram showing a partial top view of the slicing apparatus 1 when the slicing apparatus 1 slices the ingot 11, and FIG. 3B is a diagram showing a partial side view of the slicing apparatus 1 when slicing apparatus 1 slices the ingot 11. In FIG. 3B, a portion of the ingot 11 located outside the dashed line is the reformed layer 11a.

First, the ingot 11 is disposed on the ingot holder 12, as shown in FIG. 1. Then, the height detecting unit 16 and the columns 20, 21 are moved so that the height detecting unit 16, the reforming unit 17, and the temperature detecting unit 18 are arranged in the circumferential direction of the portion of the ingot 11 with which the slicing tool 13 comes into contact, and the ingot 11 is rotated counterclockwise. The ingot 11 is rotated so that the height detecting unit 16 detects a portion of the ingot 11, the reforming unit 17 applies a heat quantity to the portion, the temperature detecting unit 18 detects the temperature of the portion applied with the heat quantity, and then the slicing tool 13 comes into contact with the portion.

The control unit outputs a control signal to the height detecting unit 16 so that the height detecting unit 16 detects the height of the portion of the ingot 11 with which the slicing tool 13 comes into contact. Then, the control unit outputs a control signal the reforming unit 17 so that the reforming unit 17 applies the heat quantity in proportional to the height detected by the height detecting unit 16. The control unit increases the heat quantity applied from the reforming unit 17 to the ingot 11 when the detected height is high, and the control unit decreases the heat quantity applied from the reforming unit 17 to the ingot 11 when the detected height is low so that the reformed layer 11a is formed to the portion of the ingot 11 at the predetermined distance from the rotation axis. The reforming unit 17 may apply the heat quantity so that the reformed layer 11a is formed to a depth to which the slicing tool 13 cuts at one time in addition to the detected height. In the present embodiment, the reforming unit 17 applies the heat quantity so that the reformed layer 11a is formed to the portion at the predetermined distance from the rotation axis and the reformed layer 11a is formed to the depth to which the slicing tool 13 cuts at one time.

The control unit outputs a control signal to the temperature detecting unit 18 so that the temperature detecting unit 18 detects the temperature of the portion of the ingot 11 applied with the heat quantity. Then, the control unit compares the detected temperature and the threshold values. The control unit increases the heat quantity applied from the reforming unit 17 when the detected temperature is lower than the minimum threshold value. This is because, when the temperature detected by the temperature detecting unit 18 is lower than the minimum threshold value, the heat quantity applied from the reforming unit 17 is so small that the reformed layer 11a is not formed in the ingot 11 or the reformed layer 11a is not formed to the predetermined depth. The control unit decreases the heat quantity applied from the reforming unit 17 when the detected temperature is higher than the maximum threshold value. This is because, when the temperature detected by the temperature detecting unit 18 is higher than the maximum threshold value, the heat quantity applied from the reforming unit 17 is so large that the reformed layer 11a is formed to a depth that is deeper than the predetermined depth.

By moving the column 15 in a state where the slicing tool 13 is rotated, the slicing tool 13 comes into contact with the portion of the ingot 11 applied with the heat quantity, that is, the reformed layer 11a, and the slicing tool 13 slices the ingot 11 by cutting the reformed layer 11a.

The control unit outputs a control signal to the resistance detecting unit 19 so that the resistance detecting unit 19 detects the resistance (load) that is generated when the slicing tool 13 comes into contact with the ingot 11. Then, the control unit compares the detected resistance with the threshold value. This is because there is a possibility that the reformed layer 11a is not formed in the ingot 11 even when the temperature detected by the temperature detecting unit 18 is between the minimum threshold value and the maximum threshold value. When the detected resistance is higher than the threshold value, the control unit increases the heat quantity applied from the reforming unit 17. This is because, when the resistance (load) detected by the resistance detecting unit 19 is higher than the threshold value, the reformed layer 11a is not formed in the ingot 11.

After that, the column 15 is moved toward the ingot 11 while forming the reformed layer 11a in the ingot 11 by the reforming unit 17, so that the slicing tool 13 comes into contact with the portion of the ingot 11 applied with the heat quantity, that is, the reformed layer 11a, and the ingot 11 is sliced into the wafers 31.

Then, the height detecting unit 16 and the columns 20, 21 are moved so that the height detecting unit 16, the reforming unit 17, and the temperature detecting unit 18 are arranged at predetermined positions with respect to the ingot 11. The column 15 is moved toward the ingot 11 while forming the reformed layer 11a in the ingot 11 by the reforming unit 17, so that the slicing tool 13 comes into contact with the portion of the ingot 11 applied with the heat quantity, that is, the reformed layer 11a, and the ingot 11 is sliced into wafers 31.

Figure 4A:
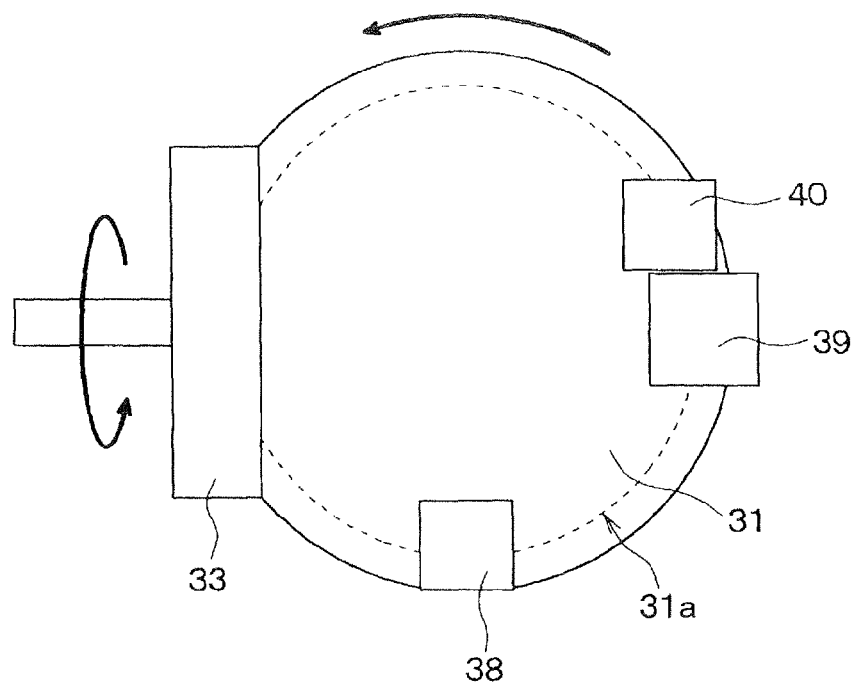
FIG. 4A is a diagram showing a partial top view of the polishing apparatus when the polishing apparatus polishes a wafer.
Figure 4B:
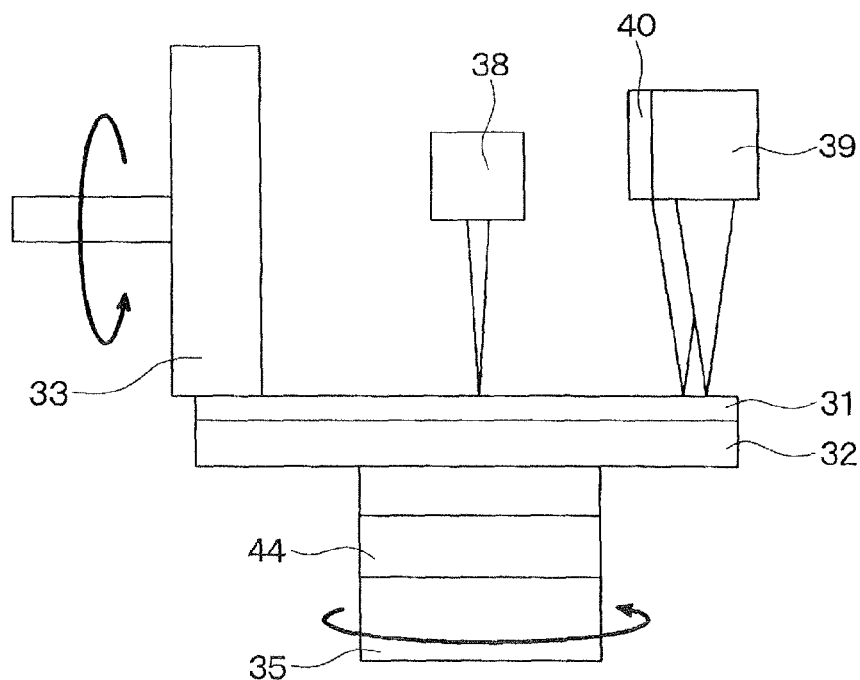
FIG. 4B is a diagram showing a partial side view of the polishing apparatus when the polishing apparatus slices the wafer.

Next, the surface of the wafer 31 is polished and planarized with the polishing apparatus 3. FIG. 4A is a diagram showing a partial top view of the polishing apparatus 3 when the polishing apparatus 3 polishes the wafer 31, and FIG. 4B is a diagram showing a partial side view of the polishing apparatus 3 when the polishing apparatus polishes the wafer 31. In FIG. 4A, the portion at which the reformed layer 31a is formed is shown by a dashed line.

Figure 2:
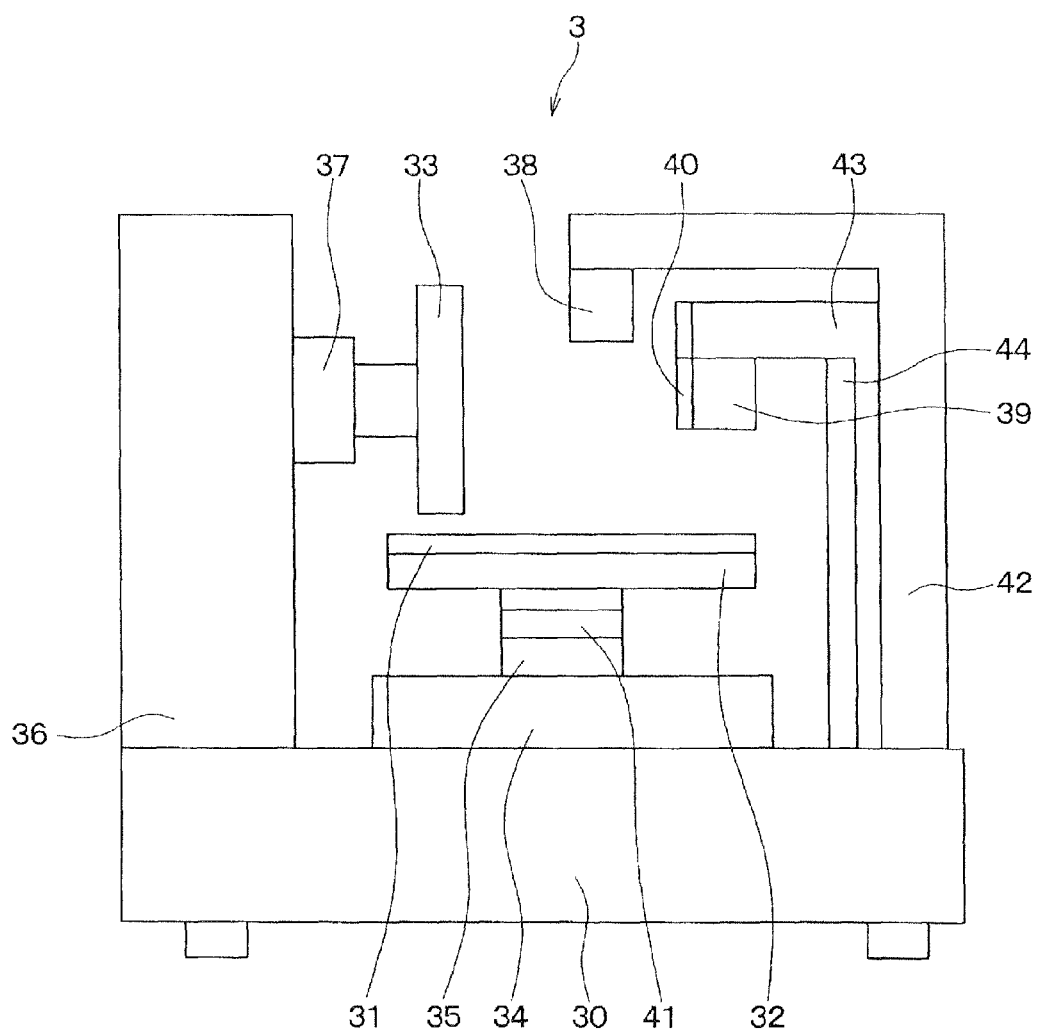
FIG. 2 is a diagram showing a polishing apparatus according to a first embodiment.

As shown in FIG. 2 and FIG. 4B, the wafer 31 formed by the above-described slicing process is disposed on the wafer holder 32. The columns 42-44 are moved so that the height detecting unit 38, the reforming unit 39, and the temperature detecting unit 40 are arranged in the circumferential direction of the portion of the wafer 31 with which the polishing tool 33 comes into contact. Then, as shown in FIG. 4A and FIG. 4B, the wafer 31 is rotated counterclockwise as viewed from above the wafer 31. The wafer 31 is rotated so that the height detecting unit 38 detects a portion of the wafer 31, the reforming unit 39 applies a heat quantity to the portion, the temperature detecting unit 40 detects the temperature of the portion applied with the heat quantity, and then the polishing tool 33 comes into contact with the portion.

The control unit outputs a control signal to the height detecting unit 38 so that the height detecting unit 38 detects the height of the portion of the wafer 31 with which the polishing tool 33 comes into contact. Then, the control unit outputs a control signal the reforming unit 39 so that the reforming unit 39 applies the heat quantity in proportional to the height detected by the height detecting unit 38. The control unit increases the heat quantity applied from the reforming unit 39 to the wafer 31 when the detected height is height, and the control unit decreases the heat quantity applied from the reforming unit 39 to the wafer 31 when the detected height is low so that the reformed layer 31a is formed to the portion of the wafer 31 at the predetermined distance from the surface of the wafer holder 32. The reforming unit 39 may apply the heat quantity so that the reformed layer 31a is formed to a depth to which the polishing tool 33 polishes at one time in addition to the detected height. In the present embodiment, the reforming unit 39 applies the heat quantity so that the reformed layer 31a is formed to the portion at the predetermined distance from the surface of the wafer holder 32 and the reformed layer 31a is formed to the depth to which the polishing tool 33 polishes at one time.

The control unit outputs a control signal to the temperature detecting unit 40 so that the temperature detecting unit 40 detects the temperature of the portion of the wafer 31 applied with the heat quantity. Then, the control unit compares the detected temperature and the threshold values. The control unit increases the heat quantity applied from the reforming unit 39 when the detected temperature is lower than the minimum threshold value. This is because, when the temperature detected by the temperature detecting unit 18 is lower than the minimum threshold value, the heat quantity applied from the reforming unit 39 is so small that the reformed layer 31a is not formed in the wafer 31 or the reformed layer 31a is not formed to the predetermined depth. The control unit decreases the heat quantity applied from the reforming unit 39 when the detected temperature is higher than the maximum threshold value. This is because, when the temperature detected by the temperature detecting unit 40 is higher than the maximum threshold value, the heat quantity applied from the reforming unit 39 is so large that the reformed layer 31a is formed to a depth that is deeper than the predetermined depth.

By expanding the saddle 34 in a state where the polishing tool 33 is rotated, the polishing tool 33 comes into contact with the portion of the wafer 31 applied with the heat quantity, that is, the reformed layer 31a, and the polishing tool 33 polishes the surface of the wafer 31 by removing the reformed layer 31a.

The control unit outputs a control signal to the resistance detecting unit 41 so that the resistance detecting unit 41 detects the resistance (load) that is generated when the polishing tool 33 comes into contact with the wafer 31. Then, the control unit compares the detected resistance with the threshold value. This is because there is a possibility that the reformed layer 31a is not formed in the wafer 31 even when the temperature detected by the temperature detecting unit 18 is between the minimum threshold value and the maximum threshold value. When the detected resistance is higher than the threshold value, the control unit increases the heat quantity applied from the reforming unit 39. This is because, when the resistance (load) detected by the resistance detecting unit 41 is higher than the threshold value, the reformed layer 31a is not formed in the wafer 31.

Then, the columns 36, 42-44 are moved slightly toward a center of the wafer 31, the polishing tool 33 polishes the surface of the wafer 31 while forming the reformed layer 31a inside the dashed portion shown in FIG. 4A. By repeating a process of moving the columns 36, 42-44 slightly toward the center of the wafer 31 and a process of polishing the surface of the wafer 31 while forming the reformed layer 31a, the whole surface of the wafer 31 is polished. In other words, in the present embodiment, the whole surface of the wafer 31 is polished by forming the reformed layer 31a and polishing the reformed layer 31a while moving the columns 36, 42-44 toward the center of the wafer 31 gradually.

As described above, the slicing apparatus 1 includes the reforming unit 17. The reforming unit 17 applies the heat quantity to the portion of the ingot 11 with which the slicing tool 13 comes into contact so as to form the reformed layer 11a, and the slicing tool 13 comes into contact with the reformed layer 11a and slices the ingot 11.

The reformed layer 11a has a lower hardness than the ingot 11. Thus, compared with a case where the ingot 11 is sliced without forming the reformed layer 11a, the polishing resistance can be reduced and the slicing time of the ingot 11 can be reduced. Furthermore, because a formation of asperity on the surface of the wafer 31 can be restricted, a time required for the polishing process can be reduced. Thus, a wafer processing efficiency can be improved.

Also the polishing apparatus 3 includes the reforming unit 39. The reforming unit 39 applies the heat quantity to the portion of the wafer 31 with which the polishing tool 33 comes into contact so as to form the reformed layer 31a, and the polishing tool 33 comes into contact with the reformed layer 31a and polishes the wafer 31.

Because the polishing apparatus 3 can perform a reforming process for forming the reformed layer 31a and a polishing process for polishing the wafer 31 in a single apparatus, the wafer processing efficiency can be improved compared with a conventional wafer processing method of in which the reforming process and the polishing process are performed with different apparatuses.

In addition, because the reformed layer 31a is formed by applying the heat quantity to the wafer 31, the damage of the polishing apparatus 3 can be restricted compared with a wafer polishing process that uses an oxidizing agent.

The slicing apparatus 1 includes the height detecting unit 16, and the reforming unit 17 applies the heat quantity to the ingot 11 so that the reformed layer 11a is formed to the depth to which the slicing tool 13 cuts at one time. Thus, the reformed layer 11a can be certainly formed at the portion of the ingot 11 with which the slicing tool 13 comes into contact, and the wafer processing efficiency can be further improved.

Also the polishing apparatus 3 includes the height detecting unit 38, and the reforming unit 39 applies the heat quantity to the wafer 31 so that the reformed layer 31a is formed to the depth to which the polishing tool 33 polishes at one time. Thus, the reformed layer 31a can be certainly formed at the portion of the wafer 31 with which the polishing tool 33 comes into contact, and the wafer processing efficiency can be further improved.

The slicing apparatus 1 further includes the temperature detecting unit 18 and the resistance detecting unit 19, and the heat quantity applied from the reforming unit 17 is controlled so that the reformed layer 11a can be certainly formed in the ingot 11. Thus, the reformed layer 11a can be certainly formed at the portion of the ingot 11 with which the slicing tool 13 comes into contact, and the wafer processing process can be further improved. The temperature detecting unit 18 detects the portion of the ingot 11 applied with the heat quantity. When the detected temperature is higher than the maximum threshold value, that is, when the reformed layer 11a is formed to a depth that is deeper than the predetermined depth, the heat quantity applied to the ingot 11 is decreased so that the reformed layer 11a can be formed to the predetermined depth. When the detected temperature is lower than the minimum threshold value, that is, when the reformed layer 11a is not formed in the ingot 11 or when the reformed layer 11a is not formed to the predetermined depth, the heat quantity applied to the ingot 11 is increased so that the reformed layer 11a can be formed to the predetermined depth.

Also the polishing apparatus 3 includes the temperature detecting unit 40 and the resistance detecting unit 41, and the heat quantity applied from the reforming unit 39 is controlled so that the reformed layer 31a can be certainly formed in the wafer 31. Thus, the reformed layer 31a can be certainly formed at the portion of the wafer 31 with which the polishing tool 33 comes into contact, and the wafer processing efficiency can be further improved. The temperature detecting unit 40 detects the portion of the wafer 31 applied with the heat quantity. When the detected temperature is higher than the maximum threshold value, that is, when the reformed layer 31a is formed to a depth that is deeper than the predetermined depth, the heat quantity applied to the wafer 31 is decreased so that the reformed layer 31a can be formed to the predetermined depth. When the detected temperature is lower than the minimum threshold value, that is, when the reformed layer 31a is not formed in the wafer 31 or when the reformed layer 31a is not formed to the predetermined depth, the heat quantity applied to the wafer 31 is increased so that the reformed layer 31a can be formed to the predetermined depth.

Second Embodiment

A slicing apparatus 1 and a polishing apparatus 3 according to a second embodiment will be described below. First, the slicing apparatus 1 will be described with reference to FIG. 5A and FIG. 5B As shown in FIG. 5B, the slicing apparatus 1 includes the slicing tool 13 that includes a conductive bonding member 13a and a plurality of grindstones 13b arranged on a peripheral surface of the bonding member 13a. The slicing apparatus 1 further includes a power unit which is not shown. The power unit applies a predetermined voltage to the bonding member 13a and the ingot 11 so as to generate an arc discharge between the bonding member 13a and the ingot 11. The slicing apparatus 1 applies a heat quantity to the ingot 11 with the arc discharge and slices the ingot 11 with the grindstones 13b. Thus, the slicing tool 13 according to the present embodiment can function as a slicing tool for slicing the ingot 11 and can function as the reforming unit 17 for forming the reformed layer 11a in the ingot 11. In other words, in the slicing apparatus 1 according to the present embodiment, the slicing tool 13 and the reforming unit 17 are integrated.

Figure 5A:
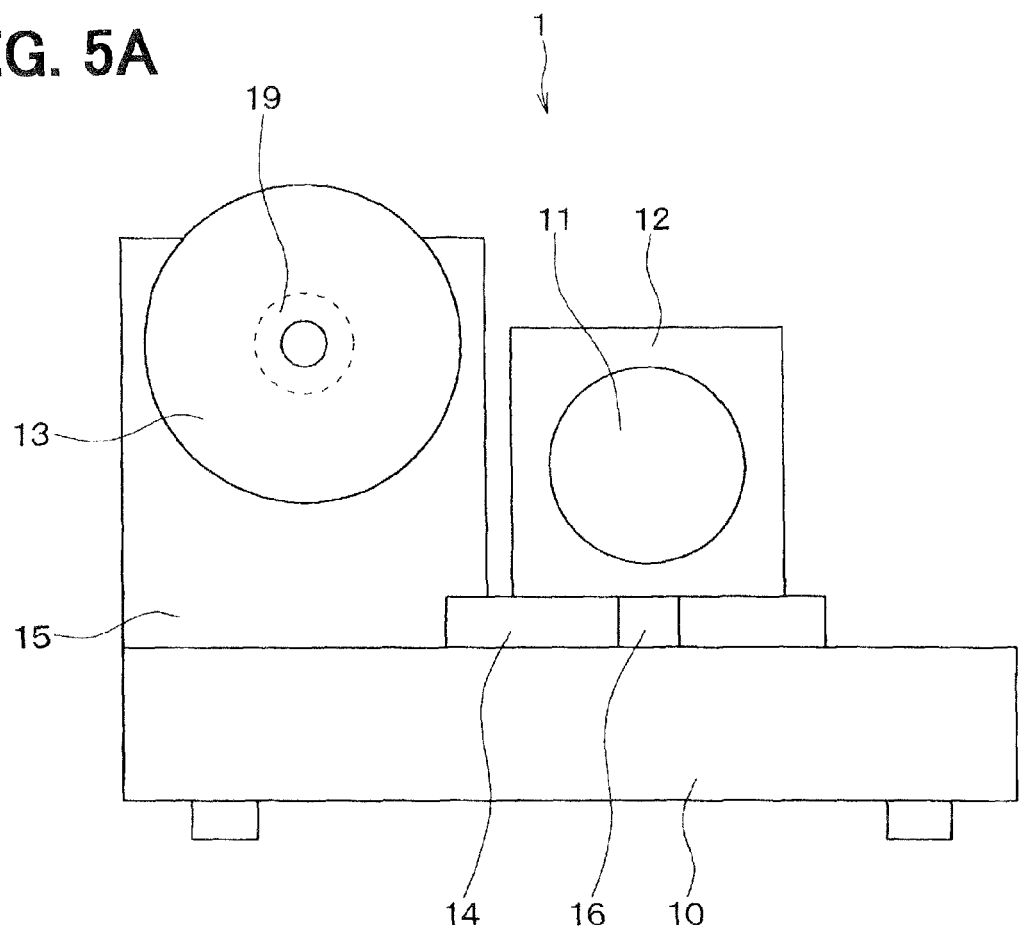
FIG. 5A is a diagram showing a slicing apparatus according to a second embodiment.
Figure 5B:
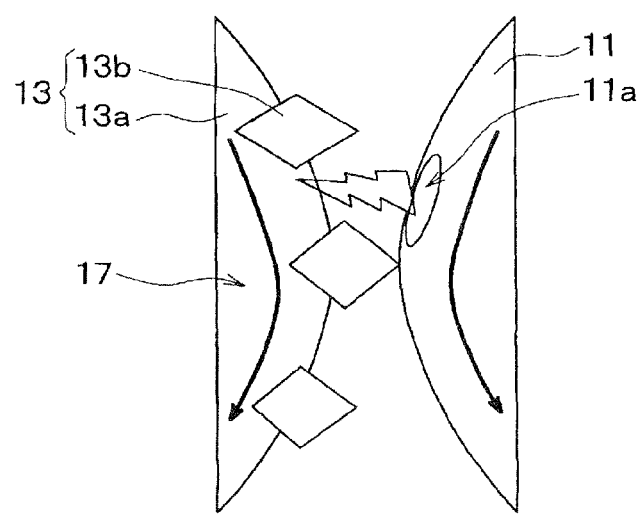
FIG. 5B is a partial enlarged view of the polishing apparatus shown in FIG. 5A.

As shown in FIG. 5A, the slicing apparatus 1 slices the ingot 11 with the grindstones 13b just after forming the reformed layer 11a in the ingot 11. Thus, compared with the first embodiment, the temperature detecting unit 18 for detecting the temperature at the portion applied with the heat quantity is not provided.

Next, the polishing apparatus 3 will be described with reference to FIG. 6A and FIG. 6B.

Figure 6A:
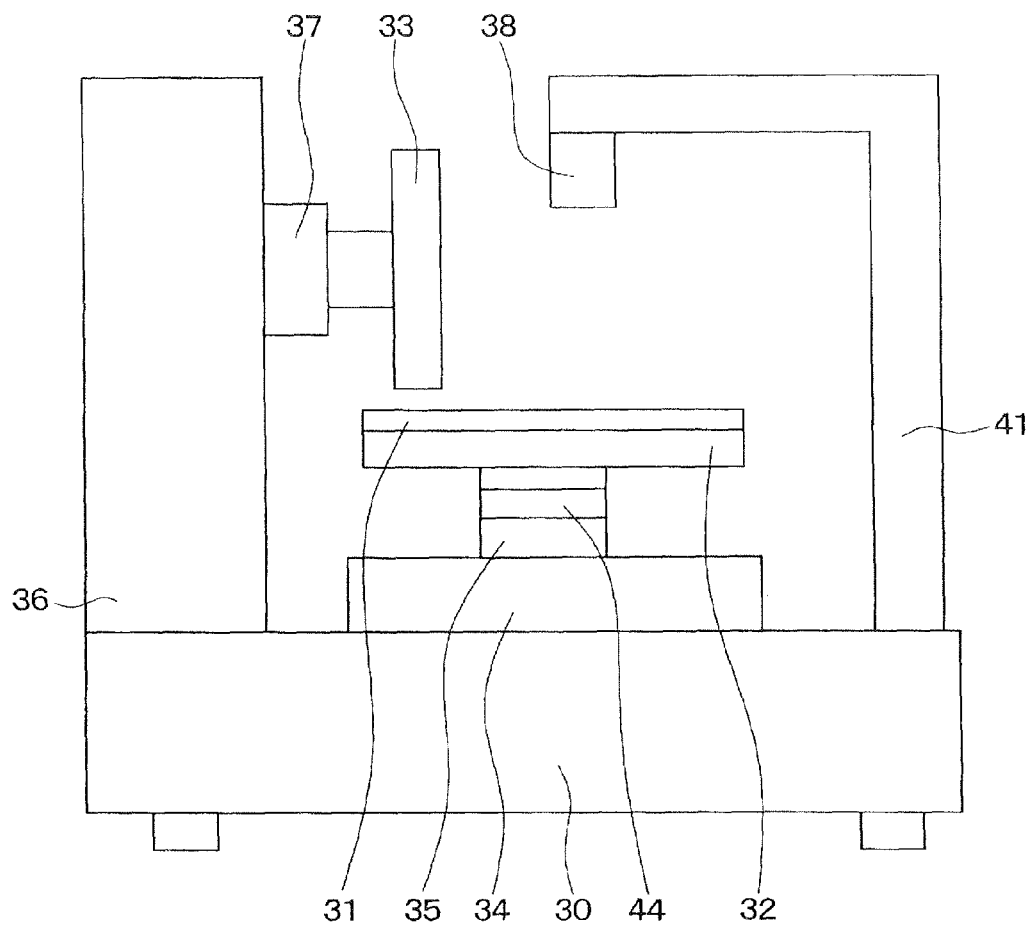
FIG. 6A is a diagram showing a polishing apparatus according to the second embodiment.
Figure 6B:
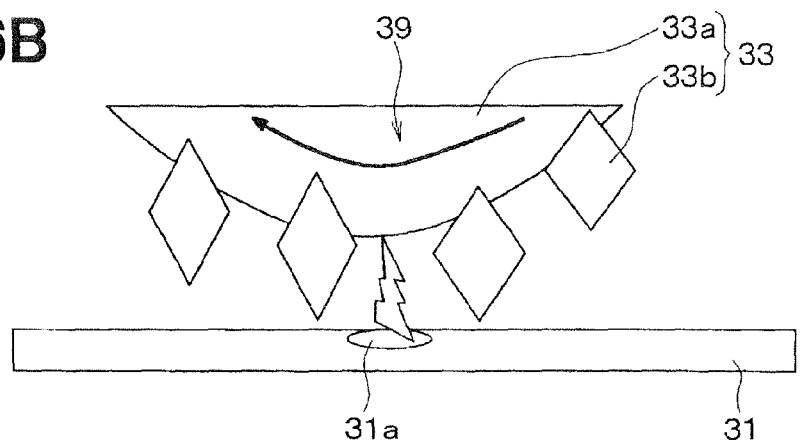
FIG. 6B is a partial enlarged view of the polishing apparatus shown in FIG. 6A.

As shown FIG. 6B, the polishing apparatus 3 includes the polishing tool 33 that includes a conductive bonding member 33a and a plurality of grindstones 33b arranged on a peripheral surface of the bonding member 33a. The polishing apparatus 3 further includes a power unit which is not shown. The power unit applies a predetermined voltage to the bonding member 33a and the wafer 31 so as to generate arc discharge between the bonding member 33a and the wafer 31. The polishing apparatus 3 applies a heat quantity to the wafer 31 with the arc discharge and polishes the wafer 31 with the grindstones 33b. Thus, the polishing tool 33 according to the present embodiment can function as a polishing tool for polishing the wafer 31 and can function as the reforming unit 39 for forming the reformed layer 31a in the wafer 31. In other words, in the polishing apparatus 3 according to the present embodiment, the polishing tool 33 and the reforming unit 39 are integrated.

As shown in FIG. 6A, the polishing apparatus 3 polishes the wafer 31 just after forming the reformed layer 31a in the wafer 31. Thus, compared with the first embodiment, the temperature detecting unit 40 for detecting the temperature at the portion applied with the heat quantity is not provided.

Next, a wafer processing method with the slicing apparatus 1 and the polishing apparatus 3 according to the present embodiment will be described below.

When the ingot 11 is sliced with the slicing apparatus 1, the control unit outputs a control signal to the height detecting unit 16 so that the height detecting unit 16 detects the height of the portion of the ingot 11 with which the slicing tool 13 comes into contact. Then, the control unit outputs a control signal to the reforming unit 17 so that the reforming unit 17 applies the heat quantity in proportional to the height detected by the height detecting unit 16 to the ingot 11. Specifically, the control unit controls the heat quantity, that is, the discharge amount applied to the ingot 11 based on the height detected by the height detecting unit 16 and the reforming unit 17 applies the controlled heat quantity to the ingot 11.

When the wafer 31 is polished with the polishing apparatus 3, the control unit outputs a control signal to the height detecting unit 38 so that the height detecting unit 38 detects the height of the portion of the wafer 31 with which the polishing tool 33 comes into contact. Then, the control unit outputs a control signal to the reforming unit 39 so that the reforming unit 39 applies the heat quantity in proportional to the height detected by the height detecting unit 38 to the wafer 31. Specifically, the control unit controls the heat quantity, that is, the discharge amount applied to the wafer 31 based on the height detected by the height detecting unit 38, and the reforming unit 17 applies the controlled heat quantity to the wafer 31.

As described above, in the slicing apparatus 1 according to the present embodiment, the slicing tool 13 includes the reforming unit 17. In the polishing apparatus 3 according to the present embodiment, the polishing tool 33 includes the reforming unit 39. Thus, the slicing apparatus 1 and the polishing apparatus 3 dot not need to include the columns 21, 43 for attaching the reforming units 17, 39 to the beds 10, 30. Therefore, effects similar to the first embodiment can be achieved while reducing the number of components.

Third Embodiment

Figure 7:
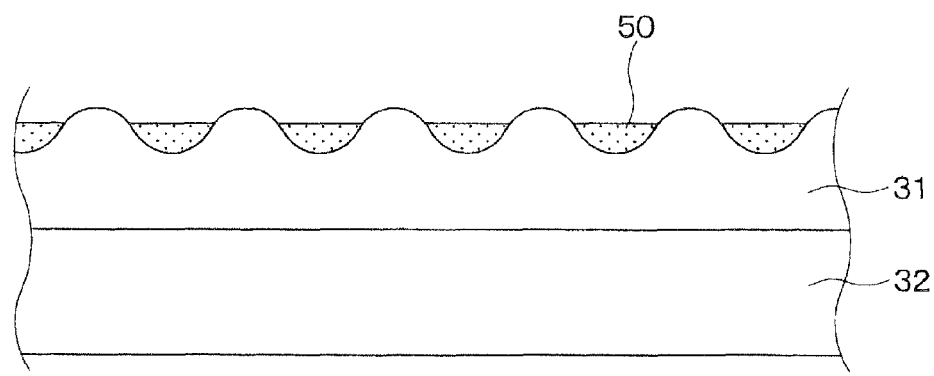
FIG. 7 is a partial enlarged view of a polishing apparatus according to a third embodiment.

A polishing apparatus 3 according to a third embodiment will be described with reference to FIG. 7. The polishing apparatus 3 according to the present embodiment includes a reflective material applying unit in addition to the polishing apparatus 3 according to the first embodiment. The reflective material applying unit is not shown in FIG. 7.

In the polishing apparatus 3 according to the present embodiment, the wafer 31 is held by the wafer holder 32 in a state where the a reflective material 50 is applied to a surface of the wafer 31 so that protruding portions on the surface are exposed outside the reflective material 50. The reflective material 50 applied to the surface of the wafer 31 has a high reflective index. For example, the reflective material 50 is water having a reflective index of 1.33 or benzene having a reflective index of 1.428.

Thus, when the wafer 31 is polished with the polishing apparatus 3, first, the reflective material 50 is applied to the surface of the wafer 31 so that the protruding portions are exposed outside the reflective material 50. Then, the reforming unit 39 applies the heat quantity to the wafer 31. In the present case, when the heat quantity is applied to the wafer 31, at the protruding portions of the wafer 31 on which the reflective material is not disposed, the heat quantity applied to the wafer 31. However, at portions of the wafer 31 on which the reflective material 50 is disposed, a part of the heat quantity is absorbed by the reflective material 50 and the heat quantity applied to the wafer 31 is reduced. Thus, the reformed layer 31a is formed to a deeper position from the surface at the protruding portions of the wafer 31 on which the reflective material 50 is not disposed, and the reformed layer 31a is formed to a shallower position from the surface at the portions of the wafer 31 on which the reflective material 50 is disposed. Thus, the depth of the reformed layer 31a can be controlled based on the roughness of the wafer 31 without applying the heat quantity in proportional to the height of the wafer 31.

Therefore, the polishing apparatus 3 according to the present embodiment can achieve effects similar to the first embodiment without changing the heat quantity based on the height of the wafer 31.

In the polishing apparatus 3, the reformed layer 31a can be formed to the predetermined distance from the surface of the wafer holder 32 without applying the heat quantity in proportional to the height of the wafer 31. Thus, the polishing apparatus 3 does not need to include the height detecting unit 38.

Other Embodiments

In the first embodiment, each of the reforming units 17, 39 applies the heat quantity to the ingot 11 or wafer 31 by irradiating a laser light, as an example. Each of the reforming units 17, 39 may also apply the heat quantity to the ingot 11 or the wafer 31 by irradiating an arc discharge or a microwave. For example, when each of the reforming units 17, 39 irradiates an arc discharge, each of the reforming units 17, 39 includes an electrode coupled with a power unit for applying a predetermined voltage to the ingot 11 or the wafer 31. When each of the reforming units 17, 39 irradiates a microwave, each of the reforming units 17, 39 includes microtrons, a conductive pipe, and a shielding plate that surrounds at least a portion at which the microwave is generated.

When the arc discharge is irradiated, an end portion of the electrode adjacent to the ingot 11 or the wafer 31 may have a taper shape. When the end portion of the electrode has the taper shape, a portion at which the arc discharge is generated is easy to control and the heat quantity is easy to apply to a predetermined portion. When the microwave is irradiated, an end portion of the conductive pipe adjacent to the ingot 11 or the wafer 31 may have a taper shape. When the end portion of the conductive pipe has the taper shape, a portion to which the microwave is irradiated is easy to control and the heat quantity is easy to apply to a predetermined portion.

In the polishing apparatus according to the third embodiment, the reforming unit 39 may also irradiate a microwave. In the present case, an absorber that absorbs the microwave is applied to the surface of the wafer 31 so that protruding portions on the surface of the wafer 31 are exposed outside the absorber.

Although the slicing apparatus 1 according to the first embodiment includes the height detecting unit 16, the temperature detecting unit 18, and the resistance detecting unit 19, the slicing apparatus 1 may also have a configuration without the height detecting unit 16, the temperature detecting unit 18, and the resistance detecting unit 19. Similarly, although the polishing apparatus 3 according to the first embodiment includes the height detecting unit 38, the temperature detecting unit 40, and the resistance detecting unit 41, the polishing apparatus 3 may also have a configuration without the height detecting unit 38, the temperature detecting unit 40, and the resistance detecting unit 41.

In the above-described first to third embodiments, the slicing tool 13 includes the grindstone as an example. The slicing tool 13 may also include a plurality of wires. In a case where the height detecting unit 16, the reforming unit 17, and the temperature detecting unit 18 are provided for each of the wires, and a plurality of wafers 31 are formed at one time by performing a process similar to the above-described wafer processing method.

In the first embodiment, the numerical aperture of the condensing lens may also be decreased so that the focus of the condensing lens becomes broader and the focus depth is increased. In the present case, if the focus of the condensing lens is set to a predetermined protruding portion of the ingot 11 when the laser is irradiated to the ingot 11, the heat quantity can be applied from the surface to a deeper position at the protruding portions of the ingot 11, and the heat quantity can be applied from the surface to a shallower position at the depressed portions of the ingot 11 without changing the focus with every irradiation. In other words, by decreasing the numerical aperture of the condensing lens, the reformed layer 11a can be formed to the portion at the predetermined distance from the rotation axis without changing the focus with every irradiation. Also the numerical aperture of the condensing lens in the reforming unit 39 may be decreased so that the focus of the condensing lens becomes broader and the focus depth is increased. In the present case, the reformed layer 31a can be formed to the portion of the wafer 31 at the predetermined distance from the surface of the wafer holder 32 without applying the heat quantity in proportional to the height of the wafer 31.

In the third embodiment, the heat quantity based on the height of the wafer 31 is applied to the wafer 31 by providing the reflective material 50 to absorb the heat quantity. In a case where the reforming unit 39 applies the heat quantity by irradiating a laser light, the following method may also be used. When a laser light is irradiated at a certain angle, the laser light is fully reflected. This phenomenon occurs when a refractive index of input-side atmosphere is smaller than a refractive index of output-side atmosphere. Normally, there is no liquid that has a lower refractive index than atmosphere. Thus, it is difficult to cause total reflection only by applying a liquid to the surface of the wafer 31. Therefore, a concentration of the reflective material 50 is controlled in such a manner that a surface portion of the reflective material 50 has a higher concentration that an under portion of the reflective material 50 so that the laser is fully reflected in the reflective material 50 and the formation of the reformed layer 31a at the depressed portions of the wafer 31 can be restricted. In other words, the reflective material applying unit applies the reflective material 50 with controlling a concentration distribution of the reflective material 50 in such a manner that the concentration decreases toward the surface of the wafer 31. Then, the reforming unit 39 irradiates the laser light toward the protruding portions of the wafer 31 exposed outside the reflective material at an angle with which the laser light is fully reflected in the reflective material 50. Accordingly, the reformed layer 31a can be formed only the portions of the wafer 31 exposed outside the reflective material 50.

In the wafer processing methods according to the first to third embodiments, the slicing apparatus 1 including the reforming unit 17 and the polishing apparatus 3 including the reforming unit 39 are used. Even when only one of the slicing apparatus 1 and the polishing apparatus 3 is used, the wafer processing efficiency can be improved compared with a conventional wafer processing method. For example, even when the ingot 11 is sliced with the slicing apparatus 1 including the reforming unit 17 and the wafer 31 is polished by a conventional wafer polishing method, the slicing time for slicing the ingot 11 can be reduced, and the roughness of the surface of the wafer 31 can be restricted. Thus, the time required for a planarization process in a post process can be reduced, and the wafer processing efficiency can be improved. Similarly, even when the ingot 11 is sliced into the wafer 31 without forming the reformed layer 11a and the wafer 31 is polished with the polishing apparatus 3 including the reforming unit 39, the polishing time can be reduced, and the wafer processing efficiency can be improved.

The polishing apparatus 3 according to the second embodiment and the polishing apparatus 3 according to the third embodiment may be combined, and the polishing tool 33 may include the reforming unit 39.

What is claimed is:

1. A wafer processing method comprising slicing an ingot into a wafer and planarizing the wafer by polishing a surface of the wafer, wherein the planarizing the wafer includes:
    disposing the wafer on a wafer holder and rotating the wafer,
    applying a heat quantity to a portion of the wafer so as to form a reformed layer at the portion of the wafer,
    bringing a polishing tool into contact with the portion of wafer while rotating the polishing tool so as to polish the portion of the wafer,
    detecting a resistance that is generated when the polishing tool is brought into contact with the wafer, and
    comparing the detected resistance with a threshold value and increasing the heat quantity applied to the portion of the wafer when the detected resistance is higher than the threshold value.

2. A wafer processing method comprising slicing an ingot into a wafer and planarizing the wafer by polishing a surface of the wafer, wherein the planarizing the wafer includes:
    disposing the wafer on a wafer holder and rotating the wafer,
    applying a heat quantity to a portion of the wafer so as to form a reformed layer at the portion of the wafer, wherein the applying the heat quantity to the portion of the wafer includes irradiating a laser light,
    bringing a polishing tool into contact with the portion of wafer while rotating the polishing tool so as to polish the portion of the wafer, and
    applying a reflective material on the surface of the wafer in such a manner that a protruding portion located on the surface of the wafer is exposed outside the reflective material before the applying the heat quantity.

3. A wafer processing method comprising slicing an ingot into a wafer and planarizing the wafer by polishing a surface of the wafer, Wherein the planarizing the wafer includes:
    disposing the wafer on a wafer holder and rotating the wafer,
    applying a heat quantity to a portion of the wafer so as to form a reformed layer at the portion of the wafer, wherein the applying the heat quantity to the portion of the wafer includes irradiating a laser light,
    bringing a polishing tool into contact with the portion of wafer while rotating the polishing tool so as to polish the portion of the wafer, and
    applying a reflective material on the surface of the wafer in such a manner that a protruding portion located on the surface of the wafer is exposed outside the reflective material and a concentration of the reflective material decreases toward the surface of the wafer before the applying the heat quantity,
    wherein the laser light is irradiated, at a predetermined angle with which the laser light is fully reflected in the reflective material and the laser light is irradiated to the protruding portion exposed outside the reflective material.

4. A wafer processing method comprising slicing an ingot into a wafer and planarizing the wafer by polishing a surface of the wafer, wherein the planarizing the wafer includes:
    disposing the wafer on a wafer holder and rotating the wafer,
    applying a heat quantity to a portion of the wafer so as to form a reformed layer at the portion of the wafer, wherein the applying the heat quantity to the portion of the wafer includes irradiating a microwave,
    bringing a polishing tool into contact with the portion of wafer while rotating the polishing tool so as to polish the portion of the wafer, and
    applying an absorber that absorbs the microwave to the surface of the wafer in such a manner that a protruding portion located on the surface of the wafer is exposed outside the absorber.

5. A wafer processing method comprising slicing an ingot into a wafer and planarizing the wafer by polishing a surface of the wafer, wherein the slicing the ignot includes:
    disposing the ignot on an ignot holder and rotating the ignot,
    applying a heat quantity to a portion of the ignot so as to form a reformed layer at the portion of the ignot, bringing a slicing tool into contact with the portion of the ignot while rotating the slicing tool so as to cut the portion of the ignot, detecting a height of the portion of the ignot to be cut before the applying the heat quantity, and controlling the heat quantity in proportion to the detected height, and wherein the planarizing the wafer further includes:

disposing the wafer on a wafer holder and rotating the wafer;

applying a heat quantity to a portion of the wafer so as to form a reformed layer at the portion of the wafer; and bringing a polishing tool into contact with the portion of wafer while rotating the polishing tool so as to polish the portion of the wafer.

6. A wafer processing method comprising slicing an ingot into a wafer and planarizing the wafer by polishing a surface of the wafer, wherein the slicing the ignot includes:

disposing the ignot on an ignot holder and rotating the ignot, applying a heat quantity to a portion of the ignot so as to form a reformed layer at the portion of the ignot, bringing a slicing tool into contact with the portion of the ignot while rotating the slicing tool so as to cut the portion of the ignot, detecting a resistance that is generated when the slicing tool is brought into contact with the ingot, and comparing the detected resistance with a threshold value and increasing the heat quantity applied to the portion of the ingot when the detected resistance is higher than the threshold value, and wherein the planarizing the wafer further includes:

disposing the wafer on a wafer holder and rotating the wafer;

applying a heat quantity to a portion of the wafer so as to form a reformed layer at the portion of the wafer; and bringing a polishing tool into contact with the portion of wafer While rotating the polishing tool so as to polish the portion of the wafer.

\* \* \* \* \*